United States Patent [19]

Gilano et al.

[11] 3,887,450

[45] June 3, 1975

[54] PHOTOPOLYMERIZABLE COMPOSITIONS CONTAINING POLYMERIC BINDING AGENTS

[75] Inventors: Michael N. Gilano, Fullerton, Calif.; Richard E. Beaupre, West Barrington, R.I.; Melvin A. Lipson, Fullerton, Calif.

[73] Assignee: Dynachem Corporation, Santa Fe Springs, Calif.

[22] Filed: Dec. 14, 1972

[21] Appl. No.: 315,153

Related U.S. Application Data

[63] Continuation of Ser. No. 112,797, Feb. 4, 1971, abandoned.

[52] U.S. Cl............ 204/159.15; 96/35.1; 96/115 P; 117/93.31; 204/159.16; 260/875; 260/879; 260/881; 260/884; 260/885; 260/886

[51] Int. Cl...... C08f 1/18; C08f 15/16; C08f 15/20; C08f 15/26; C08f 15/38; C08f 19/10

[58] Field of Search.................. 204/159.16, 159.15; 96/35.1

[56] References Cited

UNITED STATES PATENTS

| | | | |
|---|---|---|---|
| 2,893,868 | 7/1959 | Barney | 204/159.15 |
| 3,718,473 | 2/1973 | Gervay et al. | 96/35.1 |

*Primary Examiner*—Murray Tillman
*Assistant Examiner*—Thurman Kennis Page
*Attorney, Agent, or Firm*—Bert J. Lewen, Esq.

[57] ABSTRACT

In a photopolymerizable composition which comprises an addition polymer, an initiation system, and a polymerizable inhibitor, the improvement of using a preformed macromolecular binding agent which is a copolymer of a first monomer of a styrene-type material or a non-acidic vinyl compound and an unsaturated carboxyl-containing monomer, wherein the ratio of the first monomer to the unsaturated carboxyl-containing monomer is sufficient to render the binding agent soluble in a dilute alkaline solution. The composition may be developed in an alkaline aqueous solution and the resist formed thereby is impervious to conventional plating and etching solutions.

15 Claims, No Drawings

PHOTOPOLYMERIZABLE COMPOSITIONS CONTAINING POLYMERIC BINDING AGENTS

This is a continuation of application Ser. No. 112,797, filed Feb. 4, 1971, and now abandoned.

This invention relates to a new and improved photo-polymerizable composition and a method for preparing and using the same. More particularly, the invention teaches a light-sensitive composition which can be readily developed by means of an alkaline aqueous solution to yield a product which is useful for printing plates and photoresists. These compositions are particularly useful for the manufacture of printed circuits because the resists formed therefrom are impervious to conventional plating solutions.

The desirability of forming light-sensitive compositions which can be developed without the need of the conventional organic solvents has long been recognized. Organic solvents are costly, hazardous with respect to toxicity and flammability, and pollute the air and water.

The advantages of such aqueous systems were noted as far back as 1956 in U.S. Pat. No. 2,760,863; however, no specific compositions were described and it may be speculated that the patentee was unable to find a satisfactory composition. Other references to such water soluble compositions are set forth in U.S. Pat. No. 2,927,022 and U.S. Pat. No. 2,893,868. Whatever may be the merits of the compositions disclosed in these patents, it appears that such compositions, to the extent they could be developed with aqueous alkaline solutions, were either not sufficiently insoluble in the exposed portions or subject to attack by the conventional plating and etching solutions, where the photoresist was used for a printed circuit.

In accordance with this invention, it has now been discovered that photopolymerizable compositions can be produced which may be developed with aqueous alkaline solutions. Furthermore, the exposed portions of these compositions have outstanding resistance to the alkaline solutions, including the alkaline etchants and alkaline plating solutions frequently encountered in the fabrication of printed circuits and chemically machined parts.

In brief, the advantages of the invention are obtained by selecting a preformed, compatible macromolecular polymeric binding agent which is a co-polymer of (1) styrene-type or a vinyl monomer and, (2) an unsaturated carboxyl-containing monomer. The use of the composition defined herein completely eliminates the need for organic solvents and provides a highly solvent resistant resist.

The photopolymerizable compositions of this invention are composed of (1) from 10 to 60 parts by weight of a conventional addition polymerizable nongaseous ethylenically unsaturated compound, (2) 40 to 90 parts by weight of the aforesaid binding agent, (3) from 0.001 to 10 parts by weight of a conventional free-radical initiator, and (4) from 0.001 to 5 parts by weight of a conventional thermal addition polymerization inhibitor. Additionally, the compositions may contain suitable dyes and pigments and other additives, such as plasticizers and adhesion promotors, as may be necessary to enhance the physical and chemical properties of the photo-polymerizable composition.

The ethylenically unsaturated compound must contain at least one terminal ethylenic group ($CH_2{=}C{<}$) having a boiling point above 100°C. at atmospheric pressure and be capable of forming a high polymer by free-radical photo-initiated, chain propagating addition polymerization. Such compounds are disclosed in U.S. Pat. No. 2,760,863.

Preferably, the compounds are non-gaseous at 20°C and atmospheric pressure, have 1 to 4 or more terminal ethylenic groups, preferably 2 or more, and a plasticizing action on the thermoplastic polymeric binder. Suitable compounds, which may be used alone or in combination, include an alkylene or a polyalkylene glycol diacrylate prepared from alkylene glycols having 2 to 15 carbons or polyalkylene ether glycols of 1 to 10 ether linkages.

Because of their generally more rapid rate of insolubilization on exposure, presumably due to a relatively rapid establishment of a network polymer structure, an outstanding class of the low molecular weight addition polymerizable components are those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen, and sulfur. Outstanding are such materials wherein the ethylenically unsaturated groups, especially the vinylidene groups, are conjugated with ester or amide structures. The following specific compounds are further illustrative of this class: unsaturated esters of polyols, particularly such esters of the methylene carboxylic acids, e.g., ethylene diacrylate; diethylene glycol diacrylate; glycerol diacrylate; glycerol triacrylate; ethylene dimethacrylate; 1,3-propylene dimethacrylate; 1,2,4,-butane triol trimethacrylate; 1,4-benzene-diol dimethacrylate; pentaerythritol tetramethacrylate; 1,3-propanediol diaerylate; 1,5-pentane-diol dimethacrylate; the bis-acrylates and methacrylates of polyethylene glycols of molecular weight 200–500, and the like; unsaturated amides, particularly those of the methylene carboxylic acids, and especially those of alpha, omega-diamines and oxygen-interrupted omega-diamines, such as methylene bisacrylamide; methylene bis-methacrylamide; 1,6-hexamethylene bisacrylamide; diethylene triamine tris-methacrylamide; bis (methacrylamidopropoxy) ethane; beta-methacrylamidoethyl methacrylate; N-[(beta-hydroxyethyl-oxy)ethyl] acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes, such as sorbaldehyde (hexadienal).

The preferred monomeric compounds are di- or poly- functional, but monofunctional monomers can also be used. The amount of monomer added varies with the particular thermoplastic polymer.

The styrene-type constituent of the polymeric binder may have the general formula:

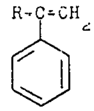

wherein R is hydrogen or an alkyl group having from 1 to 6 carbon atoms or a halo group. The benzene ring may be ring substituted with functional groups, such as nitro, alkoxy, acyl, carboxyl, sulpho, hydroxyl or halo. From 1 to 5 benzene substituents may be present, preferably, the substituents are a single alkyl group such as methyl or t-butyl group. Most preferred of these compounds are styrene, alpha-methyl styrene, para-methyl styrene and para-t-butyl styrene.

The vinyl monomer constituent of the polymeric binder is non-acidic and has the general formula:

$$CH_2{=}\underset{\displaystyle X}{\underset{|}{C}}{-}Y$$

wherein, when X is hydrogen, Y is $OOCR_1$, $OR_1$, $OCR_1$, $COOR_1$, CN, $CH_2{=}CH{-}$, $NR_3R_4$ or Cl; when X is methyl, Y is $COOR_1$, CN, $CH_2{=}CH{-}$, or $NR_3R_4$; and when X is chlorine, Y is Cl; and wherein $R_1$ is an alkyl groups having from 1 to 12 carbon atoms, a phenyl or a benzyl group and $R_3$ and $R_4$ are hydrogen, an alkyl group having 1 to 12 carbon atoms or a benzyl group.

Examples of these vinyl monomers are vinyl acetate, vinyl butyrate, vinyl benzoate, vinyl chloride, vinylidene chloride, methyl methacrylate and methyl acrylate, acrylonitrile and methacrylonitrile, methacrylamide, and alkyl substituted acrylamides, vinyl methyl ketone, vinyl propyl ketone, vinyl methyl ethyl, vinyl ethyl ether and vinyl hexyl ether.

The second comonomer may be one or more unsaturated carboxyl containing monomers having from 3 to 15 carbon atoms, preferably, from 3 to 6. Most preferred compounds are acrylic acid and methacrylic acid. Other acids which may be used are cinnamic acid, crotonic acid, sorbic acid, itaconic acid, propiolic acid, maleic acid, and fumaric acid, or the corresponding half esters or, where possible, the corresponding anhydride.

The ratio of the styrene or vinyl component to the acidic comonomer is selected so that the copolymer is soluble in the aqueous alkali medium. If the amount of the styrene or vinyl monomer is too high, the unexposed portion will not be sufficiently soluble; on the other hand, if the amount of styrene or vinyl monomer is too low, the exposed area will be tacky, swollen, or dissolved in the aqueous alkali. As a convenient criteria, the binder copolymer should be such that a 40 percent solution in ketones or alcohols will have a viscosity of from 100 to 50,000 centipoises.

Representative comonomer ratios are 70:30 to 85:15 for styrene-acrylic acid or methacrylic acid; 35:65 to 70:30 for styrene-monobutyl maleate and 70:30 to 95:5 for vinyl acetate-crotonic acid. The degree of polymerization of the binder copolymer is such that binder forms a non-tacky continuous film after exposure and development. Broadly, the molecular weight is from 1,000 to 500,000. The ranges for the copolymer ratios and the degree of polymerization for the particular binders can be readily ascertained by testing the solubility in the dilute alkali solution of representative polymers. This represents a molecular weight of from about 1,000 to 500,000.

As noted, the resist from the practice of this invention is resistant to the usual plating and etching solutions. Most surprising is its resistance to the copper pyrophosphate solution which is used in pattern plating and has an extremely high alkalinity. Other solutions which leave the resist unaffected include feric chloride, ammonium persulfate and chromic-sulfuric acid solutions.

The photoinitiators used in the compositions are preferably those activatable by actinic light and thermally inactive at 185°C. or below. These include the substituted or unsubstituted polynuclear quinones, such as, 9,10-anthraquinone; 1-chloranthraquinone, 2-chloroanthraquinone, 2-methylanthraquinone; 2-ethylanthraquinone; 2-tert-butylanthraquinone; octamethylanthraquinone; 1,4-naphthaquinone; 9,10-phenanthraquinone; 1,2-benzathraquinone; 2,3-benzanthraquinone; 2-methyl-1,4-naphthaquinone; 2,3-dichloronaphthaquinone 1,4-dimethylanthraquinone; 2,3-dimethylanthraquinone; 2-phenylanthraquinone; 2,3-diphenylanthraquinone; sodium salt of anthraquinone alpha-sulfonic acid; 3-chloro-2-methylanthraquinone; retenequinone; 7,8,9,-10-tetrahydronaphthacenequinone; 1,2,3,4-tetrahydrobenz(a) anthracene-7,12-dione.

The following photoinitiators, described in U.S. Pat. No. 2,760,863, some of which may be thermally active at temperatures as low as 85°C., are also useful: vicinal ketaldonyl compounds, such as, diacetyl and benzil; alpha-ketaldonyl alcohols, such as, benzoin and pivaloin; acyloin ethers, e.g., benzoin methyl and ethyl ethers; alpha-hydrocarbon substituted aromatic acyloins; alpha-methylbenzoin; alpha-allylbenzoin; and alpha-phenylbenzion.

Silver persulfate is also useful as a free-radical generating initiators activatable by actinic radiation. Certain aromatic ketones, e.g., benzophenone and 4,4'-bis-dialkylamino-benzophenones, are also useful.

Thermal polymerization inhibitors are also present in the preferred compositions. These include p-methoxyphenol, hydroquinone, and alkyl and aryl-substituted hydroquinones and quinones, tert-butyl catechol, pyrogallol, copper resinate, naphthylamines, betanaphthol, cuprous chloride, 2,6-di-tert-butyl p-cresol, 2,2-methylenebis-(4-ethyl-6-t-butylphenol), phenothiazine, pyridine, nitrobenzene, dinitrobenzene, p-toluquinone, chloranil, aryl phosphites, and aryl alkyl phosphites.

If desired, the compositions may contain dyes and pigments. Suitable colorants will be compatible with the photosensitive compositions and not interfere appreciably with the photosensitivity of the composition. The following specific compounds are illustrative: Fuchsine (C. I. 42510); Auramine Base (C. I. 4100B); Calcocid Green S (C. I. 44090); Para Magenta (C. I. 42500); Tryparosan (C. I. 42505); New Magenta (C. I. 42520); Acid Violet RRH (C. I. 42425); Red Violet 5RS (C. I. 42690); Nile Blue 2B (C. I. 51185); New Methylene Blue GG (C. I. 51195); C. I. Basic Blue 20 (C. I. 42585); Iodone Green (C. I. 42556); Night Green B (C. I. 42115); C. I. Direct Yellow 9 (C. I. 19540); C. I. Acid Yellow 17 (C. I. 18965); C. I. Acid Yellow 29 (C. I. 18900); Tartrazine (C. I. 19140); Supramine Yellow G (C. I. 19300); Buffalo Black 10B (C. I. 27790); Naphthalene Black 12R (C. I. 20350); Fast Black L (C. I. 51215); Ethyl Violet (C. I. 42600); Pontacyl Wool Blue BL (C. I. 50315); Pontacyl Wood Blue GL (C. I. 52320). (Numbers obtained from the second edition of Color Index.)

The photopolymerizable elements are exposed to a source of actinic radiation. This may be through a half-tone image or a process transparency, e.g., a process negative or positive, stencil, or a mask. The exposure may also be through a continuous tone, negative or positive image. The exposure may be by the contact of projection method, with or without a cover sheet over the photopolymerizable layer or by projection using a cover sheet. These procedures are well known to those skilled in the art.

Since free-radical generating addition-polymerization initiators activatable by actinic radiation generally exhibit their maximum sensitivity in the ultraviolet range, the radiation source should furnish an effective amount of this radiation. Both point or broad radiation sources are effective. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sun lamps, are most suitable. In certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

The photopolymerizable compositions after exposure can be developed, e.g., by impingement of spray jets, with agitated immersion brushing or scrubbing to desirable images with aqueous bases, i.e., aqueous solutions of water-soluble bases in concentrations generally in the range from 0.01 to 10 percent by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; amines having a baseionization constant greater than about $1 \times 10^{-6}$, e.g., primary amines, such as, benzyl, butyl and allyl amines; secondary amines, e.g., dimethylamine and benzyl methyl amine; tertiary amines, e.g., trimethylamine, and triethylamine; primary, secondary, and tertiary hydroxyamines, e.g., propanol, diethanol and triethanol amines, and 2-amino-2-hydroxymethyl-1,3-propanediol; cyclic amines, e.g., morpholine, piperidine, piperazine, and pyridine; polyamines, such as hydrazine, ethylene and hexamethylene amines; the water-soluble basic salts, e.g., the carbonates and bicarbonates of the above amines; ammonium hydroxide and tetra-substituted ammonium hydroxides, e.g., tetramethyl-, tetraethyl-, trimethylbenzyl-, and trimethylphenylammonium hydroxides, sulfonium hydroxides, e.g., trimethyl-, diethylmethyl-, dimethylbenzylsulfonium hydroxides, and the basic soluble salts thereof, e.g., the carbonates, bicarbonates and sulfides; alkali metal phosphates and pyrophosphates, e.g. sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

The photopolymerized compositions can generally be removed by immersion in heated aqueous solutions of strong alkalies or, if desired, in proprietary stripping formulas well known in the art.

To further illustrate the invention attention is directed to the following examples.

EXAMPLE I

The following solution was coated onto a 1 mil thick polyester film, and dried in air. The dry thickness of the sensitized layer was about 0.001 inch. The dried layer was covered with a 1 mil thick polyethylene film.

| | |
|---|---|
| Copolymer of 37% styrene and 63% mono-butyl maleate, average mol. wt. 20,000, viscosity of 10% aqueous solution of ammonium salt = 150 cps. | 67.0 g |
| Trimethylolpropane triacrylate | 22.0 g |
| Tetraethylene glycol diacrylate | 11.0 g |
| Benzophenone | 2.3 g |
| 4,4'-bis-(dimethylamino)-benzophenone | 0.3 g |
| 2,2'-methylene-bis (4-ethyl-6-tert-butyl phenol) | 0.1 g |
| Methyl violet 2B Base | 0.07 g |
| Benzotriazole | 0.20 g |
| Methyl ethyl ketone | 140.0 g |

A piece of copper clad, epoxy-fiber glass board was cleaned by scouring with an abrasive cleaner, swabbing and thoroughly rinsing in water. It was then given a 20-second dip in a dilute hydrochloric acid solution (2 volumes water plus 1 volume conc. hydrochloric acid), a second rinse with water and then dried with air jets.

The polyethylene cover film was removed from a section of the sandwiched photopolymerizable element. The bared resist coating with its polyester support was laminated to the clean copper with the surface of the photopolymerizable layer in contact with the copper surface. The lamination was carried out with the aid of rubber covered rollers operating at 250°. with a pressure of 3 pounds per lineal inch at the nip at a rate of 2 feet per minute. The resulting sensitized copper clad board protected as it is by the polyester film, could be held for later use if need be. Actually it was exposed to light through a high-contrast transparency image in which the conducting pattern appeared as transparent areas on an opaque background. The exposure was carried out by placing the sensitized copper clad board (with its polyester film still intact) and the transparency into a photographic printing frame. The exposure was for a period of 45 seconds to a 400 watt, 50 ampere vapor lamp at a distance of 12 inches. The polyethylene terephthalate support film was peeled off and the exposed resist layer developed by agitating the board in a tray containing 2% sodium carbonate in water for 3½ minutes followed by a water rinse. The resulting board contained a dyed resist pattern of the clear areas of the exposing transparency.

The board was now etched with a 45° Baume solution of ferric chloride, then rinsed and dried. The resist was removed from the remaining copper by dipping for 2 minutes in a 3% solution of sodium hydroxide in water at 70°C. The result was a high quality printed circuit board.

EXAMPLE II

The following solution was coated onto 1 mil thick polyester film and was allowed to dry at ambient condition for 30 minutes.

| | |
|---|---|
| Copolymer of 75% styrene and 25% methacrylic acid, viscosity of a 40% solution in methyl ethyl ketone is 10,360 cps. | 11.00 g |

-Continued

| | |
|---|---|
| Trimethylolpropane triacrylate | 4.66 g |
| Tetraethyleneglycol diacrylate | 2.33 g |
| Benzophenone | 0.75 g |
| 4,4'-bis-(dimethylamino)benzophenone | 0.10 g |
| 2,2'-methylene-bis-(4-ethyl-6-tert-butylphenol) | 0.3 g |
| Methyl Violet 2B Base | 0.2 g |
| Benzotriazole | 0.07 g |
| Methyl ethyl ketone | 30.0 g |

Dry thickness of the sensitized layer was about 1.35 mil. The coated material was then laminated onto a cleaned copper-clad board as in Example 1. Exposure was made through a transparency containing an opaque pattern of known area for 1½ minutes with an exposure unit as described in Example I. The polyester support film was peeled off and the exposed resist layer developed by agitating the board in a tray containing 2% trisodium phosphate in water for 2 minutes followed by a water rinse.

The surface of the exposed copper was further cleaned after development by dipping the board into a 20% ammonium persulfate bath for 30 seconds, washing copiously with water, dipping for 30 seconds in a 20% solution of hydrochloric acid in water, rinsing with water, then drying the board with jets of air. This cleaned board as then plated for 45 minutes at 30 amperes per square foot in a copper pyrophosphate plating bath at 55°C.

EXAMPLE III

A copper clad piece of epoxy-fiber glass board was cleaned as described in Example I. The cleaned, dried board was sensitized by flowing the following solution over the surface of the board:

| | |
|---|---|
| Copolymer of 37% styrene and 63% mono-butyl maleate, average mol. wt. 20,000, viscosity of 10% aqueous solution of ammonium salt = 150 cps. | 40.0 g |
| Pentaerythritol tetraacrylate | 23.0 g |
| Benzophenone | 1.5 g |
| 4,4'-bis-(dimethylamino)-benzophenone | 0.2 g |
| 2,2'-methylene-bis-(4-ethyl-6-tert-butylphenol) | 0.6 g |
| Methyl Violet 2B Base | 0.4 g |
| Methyl Ethyl Ketone | 100.0 g |
| Benzotriazole | 0.15 g |

The excess solution is drained off the board at room temperature for 2 minutes. The coating was further dried by heating in a forced air oven at 60°C. for 5 minutes.

After cooling, the coated board was exposed as described in Example I. The resist was developed by agitating the board in a solution of 2% trisodium phosphate in water for 1 minute followed by a water rinse. The board was now etched in ferric chloride as described in Example I. After etching, the exposed resist was stripped from the protected copper by immersing the board in a 3% solution of sodium hydroxide in water at 50°C. for 2 minutes. The result is a high quality printed circuit board.

EXAMPLE IV

The following solution was coated onto a 1 mil thick polyester film and dried in air.

-Continued

| | |
|---|---|
| Copolymer of 95% vinyl acetate and 5% crotonic acid, average mol. wt. 90,000, viscosity of 8.6% ethyl alcohol solution between 13 and 18 cps. | 70.0 g |
| Pentaerythritol tetraacrylate | 30.0 g |
| Benzophenone | 2.3 g |
| 4,4'-bis'(dimethylamino)-benzophenone | 0.3 g |
| 2,2'-methylene-bis-(4-ethyl-6-tert-butylphenol) | 0.1 g |
| Methyl Violet 2B Base | 0.07 g |
| Benzotriazole | 0.20 g |
| Methyl ethyl ketone | 150.0 g |

The dry thickness of the sensitized layer was about 0.001 inch. A copper clad board was prepared, the resist coating laminated to it, and the resulting element exposed exactly as in Example I. The support film was peeled off and the exposed resist layer developed by agitating the board in a tray containing 2% trisodium phosphate for 2 minutes followed by a water rinse.

The board was now etched as in Example I to yield a high quality printed circuit board.

EXAMPLE V

The photosensitive solution described in Example I is coated onto zinc, magnesium and copper printing plate. After drying in warm air to a dry thickness of about 0.001 inch, the photosensitive layer is coated with a dilute aqueous solution of polyvinyl alcohol and redried with warm air. The water-soluble polymer forms a thin protective barrier to oxygen. These pre-sensitized metal plates may be stored for extended periods.

Upon exposure to actinic light through a suitable photographic negative, the unexposed photosensitive layer and the water-soluble topcoat can be developed simultaneously, leaving the metal plate ready for etching. The photopolymerized image area then serves as an excellent resist for the deep-etching processes normally encountered in the fabrication of metal printing plates. These results are resistant to the common etchants, e.g., ferric chloride and nitric acid, filming agents, and banking agents commonly added to the etching mixture to control the geometry of the etch.

EXAMPLE VI

The procedure of Example V is followed, except that a 0.001 inch thick film of polyester is used as a protective layer instead of a water-soluble polymer. Following exposure to actinic light, the protective layer is peeled-off prior to developing in an aqueous alkaline solution. As in Example V, the photopolymerized image area serves as an excellent resist for the deep-etching of printing plates.

EXAMPLE VII

The photosensitive solution as described in Example I is coated onto 0.001 inch thick polyester film, dried in air, and covered with a 0.001 inch thick polyethylene film. This three layer film sandwich can be stored in sheets or rolls in light-safe areas for indefinite periods of time. Prior to use, the polyethylene cover film is peeled-off, and the photosensitive layer is placed in contact with a metallic plate of the type described in Example V and backed by lamination. Upon exposure to actinic light, the protective polyester layer is peeled-off and developed in aqueous alkaline solution. As in Example V, the photopolymerized image area is an excellent resist for the deep-etching of printing plates.

EXAMPLE VIII

The photosensitive solution as described in Example I is coated onto thin aluminum plates as commonly used in offset lithography by procedures described in Examples V, VI, and VII. Following exposure to actinic light and development in aqueous alkaline solution, the photopolymerized image area serves as an excellent ink-receptor. It also has outstanding abrasion resistance. The resulting plates can be used with excellent results for off-set lithographic printing.

EXAMPLE IX

The photosensitive solution as described in Example I is coated onto a woven, mesh-like substrate by procedures described in Examples V, VI, and VII. Following exposure to actinic light and development in aqueous alkaline solution, the photopolymerized image area serves as an excellent mask. This application has shown utility in silk-screen type printing.

Having thus described our invention what we claim and desire to protect by Letters Patent is:

1. A photopolymerizable composition comprising:

A. from 10 to 60 parts by weight of an addition polymerizable material consisting essentially of and being solely one or more non-gaseous compounds, containing at least two terminal ethylenic groups, having a boiling point above 100°C., and being selected from the group consisting of an unsaturated ester of a polyol, an unsaturated amide, and a vinyl ester;

B. from 0.001 to 10 parts by weight of a photo-initiated free-radical generating addition polymerizing initiating system;

C. from 0.001 to 5 parts by weight of a thermal-addition polymerization inhibitor; and D. from 40 to 90 parts by weight of a preformed macromolecular polymeric binding agent which is a polymer of:

a first monomeric material which contains one or more non-acidic vinyl compounds selected from the group having the general formula:

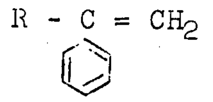

wherein R is hydrogen, an alkyl group having from 1 to 6 carbon atoms or a halo group; and a second monomeric material which consists essentially of one or more alpha,beta-unsaturated carboxyl-containing monomers having from 3 to 15 carbon atoms;

wherein the ratio of the first monomeric material to the second monomeric material is sufficient to render the binding agent soluble in a dilute aqueous solution containing from 0.01 to 10 percent of a water-soluble base.

2. A photopolymerizable composition comprising:

A. from 10 to 60 parts by weight of an addition polymerizable material consisting essentially of and being solely one or more non-gaseous compounds, containing at least two terminal ethylenic groups, having a boiling point above 100°C., and being selected from the group consisting of an unsaturated ester of a polyol, an unsaturated amide, and a vinyl ester;

B. from 0.001 to 10 parts by weight of a photo-initiated free-radical generating addition polymerizing initiating system;

C. from 0.001 to 5 parts by weight of a thermal-addition polymerization inhibitor; and D. from 40 to 90 parts by weight of a preformed macromolecular polymeric binding agent which is a polymer of:

a first monomeric material which contains one or more non-acidic vinyl compounds selected from the group having the general formula:

$$CH_2 = \underset{X}{\underset{|}{C}} - Y$$

wherein, when X is hydrogen, Y is $OOCR_1$, $OR_1$, $OCR_1$, $COOR_1$, CN, $CH{=}CH_2$, $$\overset{O}{\overset{\|}{C}}NR_3R_4$$

or Cl; when X is methyl, Y is $COOR_1$, CN, $CH{=}CH_2$, or $$\overset{O}{\overset{\|}{C}}NR_3R_4;$$

and when X is chlorine, Y is Cl; and wherein $R_1$ is an alkyl group having from 1 to 12 carbon atoms, a phenyl group or a benzyl group and $R_3$ and $R_4$ are hydrogen, an alkyl group having from 1 to 12 carbon atoms or a benzyl group; and a second monomeric material which consists essentially of one or more alpha,beta-unsaturated carboxyl-containing monomers having from 3 to 15 carbon atoms;

wherein the ratio of the first monomeric material to the second monomeric material is sufficient to render the binding agent soluble in a dilute aqueous solution containing from 0.01 to 10 percent of a water-soluble base.

3. A photopolymerizable composition comprising:

A. from 10 to 60 parts by weight of an addition polymerizable material consisting essentially of trimethylolpropane triacrylate and tetraethyleneglycol diacrylate;

B. from 0.001 to 10 parts by weight of a photo-initiated free-radical generating addition polymerizing initiating system;

C. from 0.001 to 5 parts by weight of a thermal-addition polymerizable inhibitor; and D. from 40 to 90 parts by weight of a preformed macromolecular polymeric binding agent which is a polymer of styrene and monobutyl maleate, wherein the ratio of the styrene to the monobutyl maleate is sufficient to render the binding agent soluble in a dilute aqueous solution containing from 0.01 to 10 percent of water-soluble base.

4. The photopolymerizable composition of claim 3 wherein the photo-initiated free-radical generating addition polymerizing initiating system is an admixture of benzophenone and 4,4'-bis-(dimethylamino)-benzophenone and the thermal-addition polymerizable inhibitor is 2,2'-methylene-bis(4-ethyl-6-tert-butyl phenol).

5. The photopolymerizable composition of claim 3 wherein the ratio of the styrene to monobutyl maleate in the binding agent is from about 35:65 to 70:30.

6. A photopolymerizable composition comprising:

A. from 10 to 60 parts by weight of an addition polymerizable material consisting essentially of pentaerythritol acrylates;

B. from 0.001 to 10 parts by weight of a photo-initiated free-radical generating addition polymerizing initiating system;

C. from 0.001 to 5 parts by weight of a thermal-addition polymerizable inhibitor; and D. from 40 to 90 parts by weight of a preformed macromolecular polymeric binding agent which is a polymer of styrene and monobutyl maleate, wherein the ratio of the styrene to the monobutyl maleate is sufficient to render the binding agent soluble in a dilute aqueous solution containing from 0.01 to 10 percent of a water-soluble base.

7. The photopolymerizable composition of claim 6 wherein the photo-initiated free-radical generating addition polymerizing initiating system is an admixture of benzophenone and 4,4'-bis(dimethylamino)-benzophenone and the thermal-addition polymerizable inhibitor is 2,2'-methylene-bis(4-ethyl-6-tertbutyl phenol).

8. The photopolymerizable composition of claim 6 wherein the ratio of the styrene to monobutyl maleate in the binding agent is from about 35:65 to 70:30.

9. A photopolymerizable composition comprising:

A. from 10 to 60 parts by weight of an addition polymerizable material consisting essentially of pentaerythritol acrylates;

B. from 0.001 to 10 parts by weight of a photo-initiated free-radical generating addition polymerizing initiating system;

C. from 0.001 to 5 parts by weight of a thermal-addition polymerizable inhibitor; and D. from 40 to 90 parts by weight of a preformed macromolecular polymeric binding agent which is a polymer of vinyl acetate and crotonic acid, wherein the ratio of the vinyl acetate to the crotonic acid is sufficient to render the binding agent soluble in a dilute aqueous solution containing from 0.01 to 10 percent of a water-soluble base.

10. The photopolymerizable composition of claim 9 wherein the photo-initiated free-radical generating addition polymerizing imitating system is an admixture of benzophenone and 4,4'-bis-(dimethylamino)-benzophenone and the thermal-addition polymerizable inhibitor is 2,2'-methylene-bis(4-ethyl-6-tert-butyl phenol).

11. The photopolymerizable composition of claim 9 wherein the vinyl acetate-crotonic acid ratio is from 70:30 to 95:5.

12. The composition of claim 1 wherein the copolymer is of styrene and an unsaturated carboxyl-containing monomer.

13. The composition of claim 1 wherein the unsaturated carboxyl-containing monomer is methacrylic acid.

14. The composition of claim 1 wherein the unsaturated carboxyl-containing monomer is acrylic acid.

15. The composition of claim 1 wherein the unsaturated-carboxyl containing monomer is maleic anhydride, maleic acid, a half-ester of maleic acid, or mixture thereof.

* * * * *

REEXAMINATION CERTIFICATE (100th)

United States Patent [19]

[11] B1 3,887,450

Gilano et al.

[45] Certificate Issued Jun. 28, 1983

[54] PHOTOPOLYMERIZABLE COMPOSITIONS CONTAINING POLYMERIC BINDING AGENTS

[75] Inventors: Michael N. Gilano, Fullerton, Calif.; Richard E. Beaupre, West Barrington, R.I.; Melvin A. Lipson, Fullerton, Calif.

[73] Assignee: Dynachem Corporation, Santa Fe Springs, Calif.

Reexamination Request

No. 90/000,017, Jul. 2, 1981

Reexamination Certificate for:

| | |
|---|---|
| Patent No.: | **3,887,450** |
| Issued: | **Jun. 3, 1975** |
| Appl. No.: | **315,153** |
| Filed: | **Dec. 14, 1972** |

Related U.S. Application Data

[63] Continuation of Ser. No. 112,797, Feb. 4, 1971, abandoned.

[51] Int. Cl.$^3$ .......................... C08F 2/48; C08F 2/46

[52] U.S. Cl. ... 204/159.15; 204/159.16; 430/281; 430/910; 430/916; 430/917; 525/255; 525/257; 525/259; 525/261; 525/285; 525/301

[58] Field of Search ... 204/159.15, 159.16; 42/54.1; 430/285, 325, 281

[56] References Cited

U.S. PATENT DOCUMENTS

| | | | |
|---|---|---|---|
| 2,690,968 | 10/1954 | Powers | 95/88 |
| 2,760,863 | 8/1956 | Plambeck, Jr. | 95/5.6 |
| 2,852,379 | 9/1958 | Hepher et al. | 96/91 |
| 3,024,180 | 3/1962 | McGraw | 204/159.17 |
| 3,036,914 | 5/1962 | Jennings | 96/84 |
| 3,440,047 | 4/1969 | Levinos et al. | 96/36.3 |
| 3,458,311 | 7/1969 | Alles | 96/35.1 |
| 3,469,982 | 9/1969 | Celeste | 96/35.1 |
| 3,475,171 | 10/1969 | Alles | 96/35.1 |
| 3,547,651 | 12/1970 | Roos | 96/115 |
| 3,615,630 | 10/1971 | Dietrich | 96/115.P |
| 3,622,334 | 11/1971 | Hurley et al. | 430/281 |
| 3,625,744 | 12/1971 | Juna et al. | 204/159.23 |
| 3,660,088 | 5/1972 | Lundsager | 96/36 |
| 3,695,877 | 10/1972 | Taneda et al. | 96/35.1 |
| 3,708,296 | 1/1973 | Schlesinger | 96/33 |
| 3,850,770 | 11/1974 | Juna et al. | 204/159.19 |

FOREIGN PATENT DOCUMENTS

| | | |
|---|---|---|
| 614181 | 2/1961 | Canada. |
| 750324 | 1/1967 | Canada. |
| 1817107 | 7/1970 | Fed. Rep. of Germany. |
| 687266 | 9/1969 | South Africa. |
| 759961 | 6/1938 | United Kingdom. |
| 801093 | 9/1958 | United Kingdom. |
| 802853 | 10/1958 | United Kingdom. |
| 835849 | 5/1960 | United Kingdom. |
| 1042520 | 9/1966 | United Kingdom. |
| 1118154 | 6/1968 | United Kingdom. |
| 1148362 | 4/1969 | United Kingdom. |
| 1180846 | 2/1970 | United Kingdom. |
| 1188921 | 4/1970 | United Kingdom. |
| 190211 | 1/1967 | U.S.S.R. |

OTHER PUBLICATIONS

Handbook of Chemistry and Physics, 41st ed. page 1721.

A technical brochure of Farbwerke Hoechst AG, entitled "Mowilith Ct 5", bearing a copyright notice dated 1964.

Kirk/Othmer, *Encyclopedia of Chemical Technology*, vol. 4 (1954), p. 616.

*Encyclopedia of Polymer Science and Technology*, vol. 1 (1964), p. 82.

*Primary Examiner*—Paul Lieberman

[57] ABSTRACT

In a photopolymerizable composition which comprises an addition polymer, an initiation system, and a polymerizable inhibitor, the improvement of using a preformed macromolecular binding agent which is a copolymer of a first monomer of a styrene-type material or a non-acidic vinyl compound and an unsaturated carboxyl-containing monomer, wherein the ratio of the first monomer to the unsaturated carboxyl-containing monomer is sufficient to render the binding agent soluble in a dilute alkaline solution. The composition may be developed in an alkaline aqueous solution and the resist formed thereby is impervious to conventional plating and etching solutions.

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, lines 24–30.

Examples of these vinyl monomers are vinyl acetate, vinyl butyrate, vinyl benzoate, vinyl chloride, vinylidene chloride, methyl methacrylate and methyl acrylate, acrylonitride and methacrylonitrile, methacrylamide, and alkyl substituted acrylamides, vinyl methly ketone, vinyl propyl ketone, vinyl methyl [ethyl] *ether,* vinyl ethyl ether and vinyl hexyl ether.

AS A RESULT OF REEXAMINATION, IT HAS BEEN DETERMINED THAT:

Claims 1–3, 6 and 9 are determined to be patentable as amended:

1. A photopolymerizable composition *characterized by being used as a photoresist in the form of a storable sheet or roll on a peelable film support* [comprising] *consisting essentially of:*

A. from 10 to 60 parts by weight of an addition polymerizable material consisting essentially of and being solely one or more non-gaseous compounds, containing at least two terminal ethylenic groups, having a boiling point above 100° C., and being selected from the group consisting of an unsaturated ester of a polyol, an unsaturated amide, and a vinyl ester;

B. from 0.001 to 10 parts by weight of a photoinitiated free-radical generating addition polymerizing initiating system;

C. from 0.001 to 5 parts by weight of a thermal-addition polymerization inhibitor; and D. from 40 to 90 parts by weight of a preformed macromolecular polymeric binding agent which is a polymer of:

a first monomeric material which contains one or more non-acidic vinyl compounds selected from the group having the general formula:

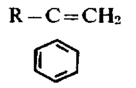

wherein R is hydrogen, an alkyl group having from 1 to 6 carbon atoms or a halo group; and a second monomeric material which consists essentially of one or more alpha,beta-*ethylenically* unsaturated [carboxyl] *carboxylic acid- or anhydride-*containing monomers having from 3 to 15 carbon atoms;

wherein the ratio of the first monomeric material to the second monomeric material is sufficient to render *substantially all of* the binding agent soluble in a dilute *substantially wholly* aqueous solution containing *2% sodium carbonate* [from 0.01 to 10 percent of a water-soluble base] *wherein following photopolymerization, the photopolymerized portion of the composition is unaffected by sequential contact first with said dilute aqueous solution containing 2% sodium carbonate and subsequently followed by a 45°* Baumé *solution of ferric chloride and further wherein the photopolymerized portion of the composition is removable from a substrate by a heated solution containing 3% sodium hydroxide.*

2. A photopolymerizable composition *characterized by being used as a photoresist in the form of a storable sheet or roll on a peelable film support* [comprising] *consisting essentially of:*

A. from 10 to 60 parts by weight of an addition polymerizable material consisting essentially of and being solely one or more non-gaseous compounds, containing at least two terminal ethylenic groups, having a boiling point above 100° C., and being selected from the group consisting of an unsaturated ester of a polyol, an unsaturated amide, and a vinyl ester;

B. from 0.001 to 10 parts by weight of a photoinitiated free-radical generating addition polymerizing initiating system;

C. from 0.001 to 5 parts by weight of a thermal-addition polymerization inhibitor; and D. from 40 to 90 parts by weight of a preformed macromolecular polymeric binding agent which is a polymer of:

a first monomeric material which contains one or more non-acidic vinyl compounds selected from the group having the general formula:

$$CH_2{=}\underset{\displaystyle X}{\underset{|}{C}}{-}Y$$

wherein, when X is hydrogen, Y is $OOCR_1$, $OR_1$, $OCR_1$, $COOR_1$, CN, [$CH{=}CH_2$,]

O $CNR_3R_4$ or Cl; when X is methyl, Y is $COOR_1$, CN, [$CH{=}CH_2$,] or $$\overset{\displaystyle O}{\overset{\|}{C}}NR_3R_4;$$

and when X is chlorine, Y is Cl; and wherein $R_1$ is an alkyl group having from 1 to 12 carbon atoms, a phenyl group or a benzyl group and $R_3$ and $R_4$ are hydrogen, an alkyl group having from 1 to 12 carbon atoms or a benzyl group; and a second monomeric material which consists essentially of one or more alpha,beta-*ethylenically* unsaturated [carboxyl] *carboxylic acid-* or *anhydride*-containing monomers having from 3 to 15 carbon atoms;

wherein the ratio of the first monomeric material to the second monomeric material is sufficient to render *substantially all of* the binding agent soluble in a dilute *substantially wholly* aqueous solution containing *2% sodium carbonate* [from 0.01 to 10 percent of a water-soluble base] *wherein following photopolymerization, the photopolymerized portion of the composition is unaffected by sequential contact first with said dilute aqueous solution containing 2% sodium carbonate and subsequently followed by a 45° Baumé solution of ferric chloride and further wherein the photopolymerized portion of the composition is removable from a substrate by a heated solution containing 3% sodium hydroxide.*

3. A photopolymerizable composition *characterized by being used as a photoresist in the form of a storable sheet or roll on a peelable film supporting* [comprising] *consisting essentially of:*

A. from 10 to 60 parts by weight of an addition polymerizable material consisting essentially of trimethylolpropane triacrylate and tetraethyleneglycol diacrylate;

B. from 0.001 to 10 parts by weight of photoinitiated free-radical generating addition polymerizing initiating system;

C. from 0.001 to 5 parts by weight of a thermal-addition polymerizable inhibitor; and D. from 40 to 90 parts by weight of a preformed macromolecular polymeric binding agent which is a polymer of styrene and monobutyl maleate, wherein the ratio of the styrene to the monobutyl maleate is sufficient to render *substantially all of* the binding agent soluble in a dilute *substantially wholly* aqueous solution containing *2% sodium carbonate* [from 0.01 to 10 percent of water-soluble base] *wherein following photopolymerization, the photopolymerized portion of the composition is unaffected by sequential contact first with said dilute aqueous solution containing 2% sodium carbonate and subsequently followed by a 45° Baumé solution of ferric chloride and further wherein the photopolymerized portion of the composition is removable from a substrate by a heated solution containing 3% sodium hydroxide.*

6. A photopolymerizable composition *characterized by being used as a photoresist in the form of a storable sheet or roll on a peelable film support* [comprising] *consisting essentially of:*

A. from 10 to 60 parts by weight of an addition polymerizable material consisting essentially of pentaerythritol acrylates;

B. from 0.001 to 10 parts by weight of photoinitiated free-radical generating addition polymerizing initiating system;

C. from 0.001 to 5 parts by weight of a thermal-addition polymerizable inhibitor; and D. from 40 to 90 parts by weight of a preformed macromolecular polymeric binding agent which is a polymer of styrene and monobutyl maleate;

wherein the ratio of the styrene to the monobutyl maleate is sufficient to render *substantially all of* the binding agent soluble in a dilute *substantially wholly* aqueous solution containing *2% sodium carbonate* [from 0.01 to 10 percent of water-soluble base] *wherein following photopolymerization, the photopolymerized portion of the composition is unaffected by sequential contact first with said dilute aqueous solution containing 2% sodium carbonate and subsequently followed by a 45° Baumé solution of ferric chloride and further wherein the photopolymerized portion of the composition is removable from a substrate by a heated solution containing 3% sodium hydroxide.*

9. A photopolymerizable composition *characterized by being used as a photoresist in the form of a storable sheet or roll on a peelable film support* [comprising] *consisting essentially of:*

A. from 10 to 60 parts by weight of an addition polymerizable material consisting essentially of pentaerythritol acrylates;

B. from 0.001 to 10 parts by weight of photoinitiated free-radical generating addition polymerizing initiating system;

C. from 0.001 to 5 parts by weight of a thermal-addition polymerizable inhibitor; and D. from 40 to 90 parts by weight of a preformed macromolecular polymeric binding agent which is a polymer of vinyl acetate and crotonic acid;

wherein the ratio of the vinyl acetate the crotonic acid is sufficient to render *substantially all of* the binding agent soluble in a dilute *substantially wholly* aqueous solution containing *2% sodium carbonate* [from 0.01 to 10 percent of water-soluble base] *wherein following photopolymerization, the photopolymerized portion of the composition is unaffected by sequential contact first with said dilute aqueous solution containing 2% sodium carbonate and subsequently followed by a 45° Baumé solution of ferric chloride and further wherein the photopolymerized portion of the composition is removable from a substrate by a heated solution containing 3% sodium hydroxide.*

Claims 4, 5, 7, 8 and 10–15, dependent on amended claims, are determined to be patentable.

New claims 16 and 17 are added and determined to be patentable.

*16. A photopolymerizable composition comprising:*

*A. from 10 to 60 parts by weight of an addition polymerizable material consisting essentially of trimethylolpropane triacrylate and tetraethyleneglycol diacrylate;*

*B. from 0.001 to 10 parts by weight of a photoinitiated free-radical generating addition polymerizing initiating system;*

*C. from 0.001 to 5 parts by weight of a thermal-addition polymerizable inhibitor; and*

*D. from 40 to 90 parts by weight of a preformed macromolecular polymeric binding agent which is a polymer of styrene and monobutyl maleate, wherein the ratio of the styrene to the monobutyl maleate in the binding agent is from about 35:65 to 70:30 and is sufficient to render the binding agent soluble in a dilute aqueous solution containing from 0.01 to 10 percent of water-soluble base.*

*17. A photopolymerizable composition comprising:*

*A. from 10 to 60 parts by weight of an addition polymerizable material consisting essentially of pentaerythritol acrylates;*

*B. from 0.001 to 10 parts by weight of a photoinitiated free-radical generating addition polymerizing initiating system;*

*C. from 0.001 to 5 parts by weight of a thermal-addition polymerizable inhibitor; and*

*D. 40 to 90 parts by weight of a preformed macromolecular polymeric binding agent which is a polymer of styrene and monobutyl maleate, wherein the ratio of the styrene to the monobutyl maleate in the binding agent is from about 35:65 to 70:30 and is sufficient to render the binding agent soluble in a dilute aqueous solution containing from 0.01 to 10 percent of a water-soluble base.*

* * * * *